(12) United States Patent
Gaboriau et al.

(10) Patent No.: US 7,706,438 B1
(45) Date of Patent: Apr. 27, 2010

(54) CIRCUITS AND METHODS FOR REDUCING NOISE AND DISTORTION IN PULSE WIDTH MODULATION SYSTEMS

(75) Inventors: Johann Guy Gaboriau, Austin, TX (US); John Laurence Melanson, Austin, TX (US); Lingli Zhang, Austin, TX (US); Melvin L. Hagge, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 1604 days.

(21) Appl. No.: 10/767,906

(22) Filed: Jan. 29, 2004

(51) Int. Cl.
  *H03K 7/08* (2006.01)
  *H03M 5/08* (2006.01)
(52) U.S. Cl. .................. 375/238; 341/53
(58) Field of Classification Search .......... 375/238, 375/371, 356, 373, 260; 341/178; 327/175, 327/141, 144, 149, 153, 155, 158, 161, 31, 327/35, 38; 381/2–7; 332/108, 109; 370/205
See application file for complete search history.

(56) References Cited

U.S. PATENT DOCUMENTS

| | | | | |
|---|---|---|---|---|
| 3,297,936 A | * | 1/1967 | Ruch | ........................... 363/25 |
| 3,927,269 A | * | 12/1975 | Yoshino et al. | ............... 348/24 |
| 4,703,251 A | * | 10/1987 | Baumgartner et al. | ....... 324/617 |
| 6,727,832 B1 | * | 4/2004 | Melanson | ................... 341/143 |
| 6,798,369 B1 | * | 9/2004 | Weber | ........................ 341/144 |
| 2004/0028243 A1 | * | 2/2004 | Seo et al. | ....................... 381/97 |
| 2005/0083116 A1 | * | 4/2005 | Risbo et al. | ................... 330/10 |
| 2005/0099490 A1 | * | 5/2005 | Stauffer et al. | .............. 347/252 |

FOREIGN PATENT DOCUMENTS

EP   1 530 287 A1 * 11/2005

\* cited by examiner

*Primary Examiner*—Tesfaldet Bocure
(74) *Attorney, Agent, or Firm*—Thompson & Knight LLP; James J. Murphy

(57) ABSTRACT

A pulse width modulation system including a pulse width modulation stage for generating a pulse width modulated signal in response to an input signal and an other pulse width modulation stage for generating an other pulse width modulated signal in response to an other input signal. Additional circuitry ensures that transitions of the pulse width modulated signal and the other pulse width modulated signal are spaced in time by a selected amount for small levels of the input signal.

21 Claims, 5 Drawing Sheets

CIRCUITS AND METHODS FOR REDUCING NOISE AND DISTORTION IN PULSE WIDTH MODULATION SYSTEMS

FIELD OF INVENTION

The present invention relates in general to pulse width modulation techniques, and in particular, to circuits and methods for reducing noise and distortion in pulse width modulation systems.

BACKGROUND OF INVENTION

Delta-sigma modulators (noise shapers) are particularly useful in digital to analog and analog to digital converters (DACs and ADCs). Using oversampling, a delta-sigma modulator spreads quantization noise power across the oversampling frequency band, which is typically much greater than the input signal bandwidth. Additionally, a delta sigma modulator performs noise shaping by acting as a lowpass filter to the input signal and a highpass filter to the noise; most of the quantization noise power is thereby shifted out of the signal band.

In addition to data conversion applications, delta-sigma noise shapers are increasingly utilized in the design of digital amplifiers. In one particular technique, a digital delta-sigma noise shaper provides a noise shaped (quantized) digital data stream to a pulse width (duty cycle) modulated (PWM) stream, which in turn drives a linear amplifier output stage and associated load. This technique is generally described in U.S. Pat. No. 5,784,017, entitled "Analogue and Digital Convertors Using Pulse Edge Modulators with Non-linearity Error Correction", granted Jul. 21, 1998, and U.S. Pat. No. 5,548,286, entitled "Analogue and Digital Convertor Using Pulse Edge Modulators with Non-linearity Error Correction", granted Aug. 20, 1996, both to Craven, U.S. Pat. No. 5,815,102, entitled "Delta Sigma PWM DAC to Reduce Switching", granted Sep. 29, 1998, to the present inventor (incorporated herein by reference), U.S. patent application Ser. No. 09/163,235 to Melanson (incorporated herein by reference), and International Patent Application No. PCT/DK97/00133 by Risbo.

One problem, which occurs in multiple-channel PWM systems, such as those used in multiple-channel DACs, is cross-coupling of energy between the associated data paths when the outputs of two or more PWM stages switch simultaneously or nearly simultaneously. The result is noise and distortion in the PWM output signals, especially when the data input to the PWM stages have a low signal level, such as during quiet periods in a digital audio data stream being converted to PWM.

Hence, given the increased use of multiple-channel PWM systems, new techniques are required for minimizing distortion and noise in multiple PWM streams as the result of time-proximate output switching of the corresponding PWM stages.

SUMMARY OF INVENTION

The principles of the present invention advantageously reduce cross-talk and related distortion and noise in multiple-channel pulse width modulation systems. According to one particular embodiment, a pulse width modulation system is disclosed including a pulse width modulation stage for generating a pulse width modulated signal in response to an input signal and an other pulse width modulation stage for generating another pulse width modulated signal in response to another input signal. Additional circuitry ensures that transitions of the pulse width modulated signal and the other pulse width modulated signal are spaced in time by a selected amount for small levels of the input signal.

Embodiments of the present principles ensure that rising and falling transitions (edges) of pulse width modulated signals in a multiple-channel PWM system do not occur simultaneously or nearly simultaneously. Consequently, the coupling of energy between channels (data paths) is substantially reduced. This feature is particularly advantageous when the channels of input data to the pulse width modulation system are close in value and have a low information content, such as during the quiet periods in an audio data stream.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-5 of the drawings, in which like numbers designate like parts.

Figure 1:
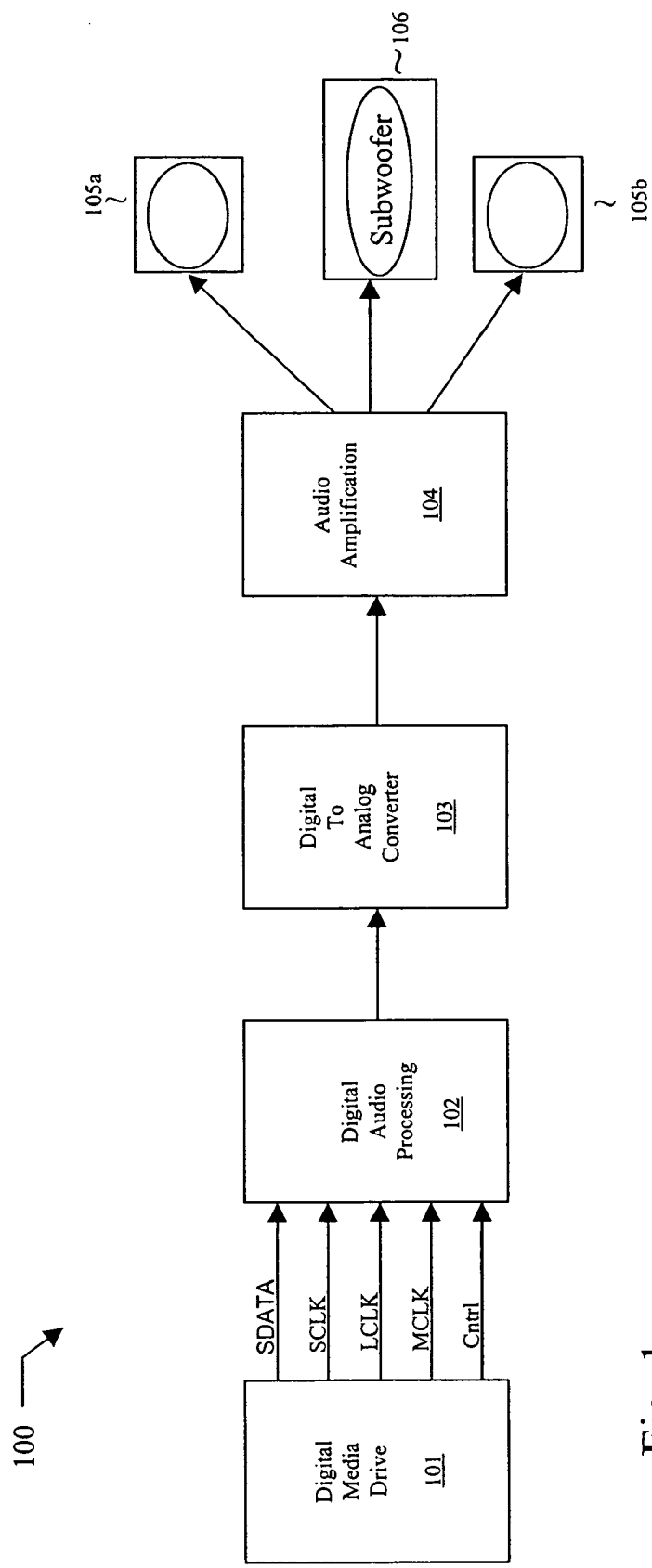
FIG. 1 is a block diagram of an exemplary audio amplifier embodying the principles of the present invention.

FIG. 1 is a diagram of an exemplary digital audio system 100 according to the principles of the present invention. Advantageously, system 100 processes digital audio input data in the digital domain prior to conversion to analog form, as discussed in detail below.

Audio data are recovered from the given digital audio storage media by a digital media drive 101, such as a compact disk (CD) player, digital audio tape (DAT) player, or digital versatile disk (DVD) unit. In the illustrated embodiment, the recovered audio data are in a multiple-bit format such as pulse-code modulation (PCM). In addition to the audio data stream, digital media drive 101 also provides the corresponding audio clock and control signals. In particular, the audio data are input in response to the serial clock (SCLK) signal, which times the input of each data bit, a left-right clock (LRCK) signal, which times the input of samples of left and right channel stereo data, and a master clock (MCLK), which controls the overall audio processing timing.

The resulting recovered data undergoes digital processing, including digital filtering, in digital audio processing block 102, prior to conversion to analog audio in digital to analog converter (DAC) 103. Audio amplification ("amplifier")

block 104 then drives a set of conventional main speakers 105a and 105b, and a subwoofer 106.

Traditional stereo audio systems drive a pair of full range audio speakers. More advanced audio systems, such as home theater systems, typically utilize a set of main speakers without extended bass response and an associated subwoofer (e.g., main speakers 105a and 105b and subwoofer 106 of FIG. 1). In these systems, digital crossover filtering is performed in digital audio processing block 102 to direct the low frequency energy to the larger subwoofer (e.g., subwoofer 106 of FIG. 1) and the higher frequency energy to the smaller main speakers (e.g., main speakers 105a and 105b of FIG. 1).

Figure 2:
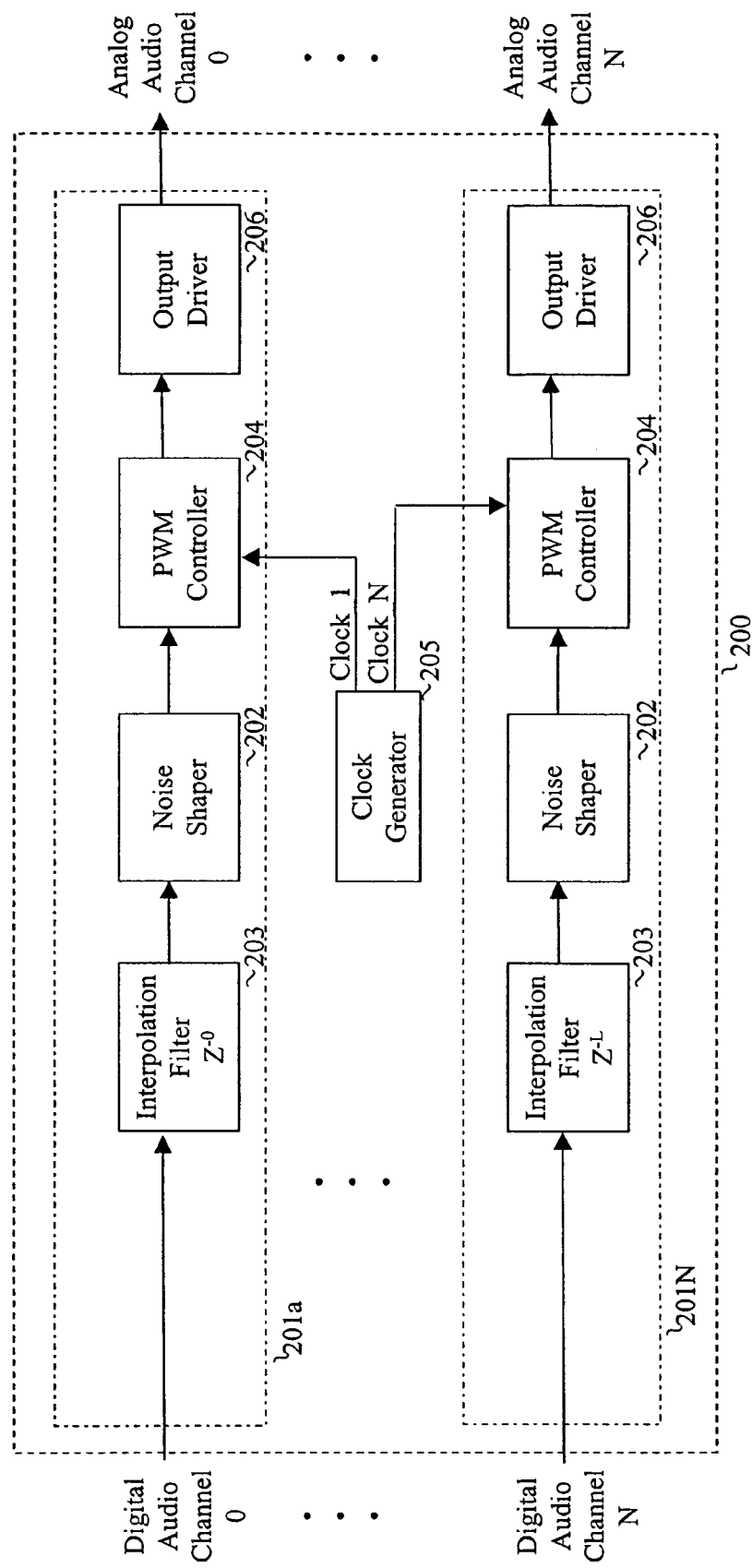
FIG. 2 is a representative multiple-channel digital to analog converter (DAC) suitable for use in the digital to analog converter shown in the system of FIG. 1.

FIG. 2 is block diagram of an exemplary multiple-channel audio DAC 200 embodying the principles of the present invention. In one particular representative application, multiple-channel DAC 200 is suitable for utilization as DAC 103 of system 100 shown in FIG. 1.

Multiple-channel audio DAC 200 is discussed in further detail below. However, generally, DAC 200 includes N number of processing paths 201a, . . . , N, two of which, 201a and 201N, are shown for reference in FIG. 2. For stereo embodiments of system 100 of FIG. 1, two processing paths 201a, . . . , N are utilized (i.e. N=2) for driving left and right channel data to main speakers 105a and 105b. The sum of the left and right channel data output from left and right processing paths 201a, . . . , N are summed to generate a bass signal for driving subwoofer 106. Home theater applications of DAC 200 typically utilize five processing paths 201a, . . . , N (i.e. N=5), for processing right, left, center, left-surround, and right-surround channel data.

Each processing path 201a, . . . , N includes a noise shaper (delta-sigma modulator) 202 for re-quantizing the corresponding channel of digital audio data DIGITAL AUDIO CHANNEL 1-DIGITAL AUDIO CHANNEL N and shifting the resulting quantization noise out of the audio band. The input data into the noise shaper 202 of each data path 201a, . . . , N is first passed through an interpolation filter 203 which increases the sampling rate. As discussed further below, the interpolation filter 203 introduces a given amount of delay to the data input into the following noise shaper 202 corresponding the data path 201a, . . . , N. Generally, in the embodiment of FIG. 2, the delay is stepped by a (M−½N) fraction PWM output period T (discussed in detail below) per data path 201a, . . . , N, in which M is the channel number. For example, for a four-channel audio system (N=4), interpolation filter 203 of data path 201a introduces a delay of a 0/N*T (i.e. $Z^{-0}$), interpolation filter 203 of data path 201b introduces a delay of a ⅛*T (i.e. $Z^{-1/8}$), interpolation filter 203 of data path 201c introduces a delay of a ⅔*T (i.e. $Z^{-2/8}$), and interpolation filter 203 of data path 201d introduces a delay of ⅜*T (i.e. $Z^{-3/8}$).

The noise shaped and re-quantized digital data output from noise shaper 202 of each data path 201a, . . . , N are converted by a PWM controller stage 204 into a duty cycle modulated data stream which drives output driver 206. A clock generator 205 generates a set of offset clock signals CLOCK_1-CLOCK_N respectively driving PWM stage 204 of the corresponding data path 201a, . . . , N. In particular, a delay of [(N−M)/2N]*T in the clock signal driving each PWM stage 204 is the inverse of the delay introduced by the interpolation filter 203 of the corresponding data path 201a, . . . , N. In the example of a four-channel system (i.e. N=4), clock generator 205 delays the clock signal CLOCK_1 driving PWM stage 204 of data path 201a by ⅜*T, delays the clock signal CLOCK_2 driving PWM stage 204 of data path 201b by ⅔*T, delays the clock signal CLOCK_3 driving PWM stage 204 of data path 201c by ⅛*T, and delays the clock signal CLOCK_4 driving PWM stage 204 of data path 201d by zero.

In turn, output driver 206 drives the analog output for the corresponding analog audio channel ANALOG AUDIO CHANNEL 1-ANALOG AUDIO CHANNEL N. For each data path 201a, . . . , N, the delays introduced by interpolation filter 203 and clock generator 205 according to the principles of the present invention, ensure that PWM data streams reaching output drivers 206 of data paths 201a, . . . , N do not switch simultaneously or nearly simultaneously. Specifically, the delays introduced by the offset clocks generated by clock generator 205 ensure that, for at least low level input signals, the edges of no two PWM output patterns from PWM stages 205 coincide and thereby create cross-talk between data paths 201a, . . . , N. The delays introduced by interpolation filters 203 ensure that the data streams output from data paths 201a, . . . , N are aligned with the same time relationship as the input streams into data paths 201a, . . . , N.

Figure 3:
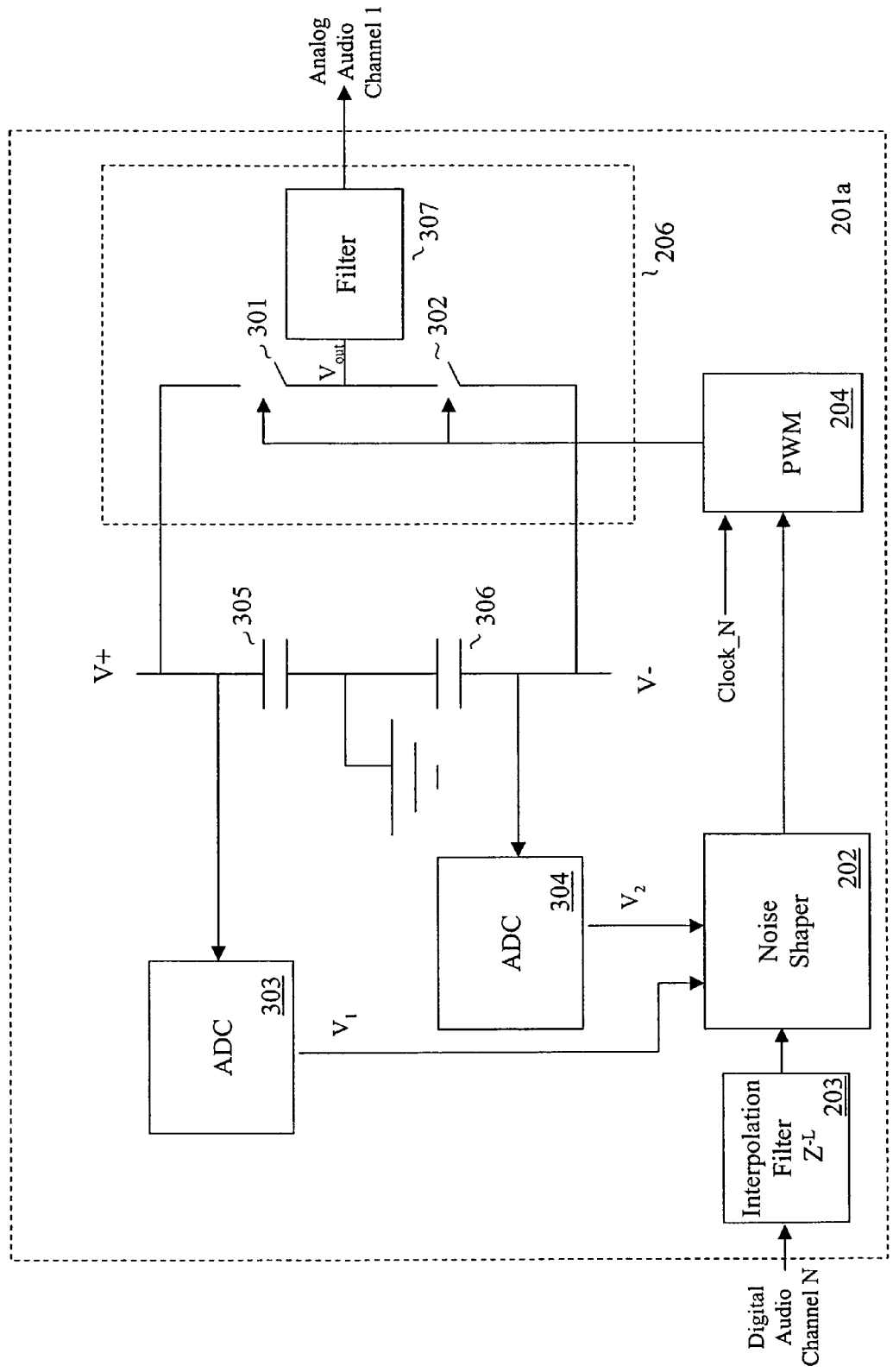
FIG. 3 is a more detailed block diagram of a selected one of the data paths shown in FIG. 2.

FIG. 3 is a more detailed operational block diagram of processing path 201a, which is representative of each of the processing paths 201a, . . . , N shown in FIG. 2. Processing path 201a includes noise shaper (delta-sigma modulator) 202, which shifts noise in the audio baseband of the input signal DIGITAL AUDIO CHANNEL 1 to higher out-of-band frequencies using oversampling and quantization. Noise shaper 202 utilizes non-linear feedback from the corresponding output stage 206 to compensate for variable moments in the following pulse width (duty cycle) modulated signal from PWM stage 204. Examples of delta-sigma modulators utilizing such non-linear feedback are described in coassigned U.S. Pat. No. 6,150,969 to Melanson, entitled Correction of Nonlinear Output Distortion In a Delta Sigma DAC, and U.S. Pat. No. 5,815,102 to Melanson, entitled Delta Sigma PWM DAC to Reduce Switching, both of which are also incorporated herein by reference. A general discussion of noise shaper (delta-sigma modulator) topologies is found in publications such as Norsworthy et al., Delta-Sigma Data Converters, Theory, Design and Simulation, IEEE Press, 1996.

Exemplary pulse-width modulator (PWM) stage 204 shown in detail in FIG. 3 converts each quantized digital sample from noise shaper 202 into a pulse width (duty-cycle) modulated data pattern. Specifically, in pulse width (duty cycle) modulation, each digital input word is converted into a pattern of logic high and logic low levels over a given time period (i.e. the duty cycle of the output signal is directly proportional to the value of the digital input word). There are a number of known techniques for partitioning the output time period into logic high and low levels to generate the output pattern with the proper duty-cycle. For example, in thirty-two level pulse width modulation of thirty-two bit digital words, each digital word is represented by a pattern across a time period T of thirty-two slots or clock periods and representing one level. In one PWM encoding scheme, a maximum negative input value is represented as an output pattern of zero (0) logic high slots and thirty-two (32) logic low slots, corresponding to a zero-percent (0% or 0/32) duty cycle. An input of zero (0) is then represented by a pattern of sixteen (16) logic low slots and sixteen (16) logic high slots corresponding to a fifty-percent (50% or 16/32) duty cycle. A maximum positive input value in this scheme is represented by a pattern with a one-hundred percent (100% or 32/32) duty cycle corresponding to thirty (32) logic high slots and zero (0) logic low slots. The distribution of the logic high slots across the entire thirty-two bit period will vary, depending on the generation technique, so long as the duty cycle is of the appropriate percentage.

The PWM stream output from pulse width modulator stage 202 in turn controls a pair of complementary switches 301 and 302, within output stage 206 of FIG. 2, which form a half-bridge between voltage supply rails V+ and V−. In particular, switch 301 drives the unfiltered analog output $V_{OUT}$ to the voltage V+ voltage rail during the logic high slots of each PWM pattern, and switch 302 drives the output $V_{OUT}$ to the V− voltage rack during the logic low slots of the PWM pattern. In alternate embodiments, a full-bridge output or capacitor-coupled output may be used in which the output operates from a single voltage supply or rail. Generally, the voltage rails are sourced from unregulated power-supplies (not shown), and consequently the voltages on the V+ and V− rails typically vary with time.

ADCs 303 and 304 respectively monitor the V+ and V− voltage rails and provide corresponding scaled digital representations $V_1$ and $V_2$ to noise shaper 202. Noise shaper 202 utilizes the outputs of ADCs 303 and 304 to correct for variations and noise in voltages V+ and V−. High frequency energy on the V+ and V− voltage rails is coupled to ground through capacitors 305 and 306. Output stage 206 further includes a linear filter 307, which generates the smooth audio output signal ANALOG AUDIO CHANNEL 1.

When one or more of the digital input values DIGITAL AUDIO CHANNEL 1-DIGITAL AUDIO CHANNEL N to data paths 201a, ... N of FIG. 2 are identical or numerically close, the outputs of the corresponding PWM stages 204 transition in close time proximity. The power supply supplying PWM stages 204 and the V+ and V− rails of output drivers 206, as shown in FIG. 3, has a non-zero output impedance which causes glitches in the power supply output during the generation of edges of the output PWM patterns. These glitches in turn cause cross-talk between data paths 201a, ... N, in particular with simultaneous or nearly simultaneous switching of the PWM patterns. Cross-talk produces noise and distortion in the ultimate audio output signals ANALOG AUDIO CHANNEL 1-ANALOG AUDIO CHANNEL N.

Except when all the input data streams DIGITAL AUDIO CHANNEL 1-DIGITAL AUDIO CHANNEL N are low (i.e. having values approaching a digital zero), the in-band signal energy through data paths 201a, ..., N is normally sufficient to mask any noise and distortion induced by time-proximate PWM output transitions, especially if only some of PWM stages 204 switch simultaneously or nearly simultaneously. However, when all inputs DIGITAL AUDIO CHANNEL 1-DIGITAL AUDIO CHANNEL N are low, the outputs of PWM stages 204 of all data paths 201a, ..., N switch in close time proximity, although no in-band signal energy is available to mask noise and distortion in the output signals ANALOG AUDIO CHANNEL 1-ANALOG AUDIO CHANNEL N. The timing of the generated PWM patterns therefore has a direct impact on the audio output quality.

Figure 4:
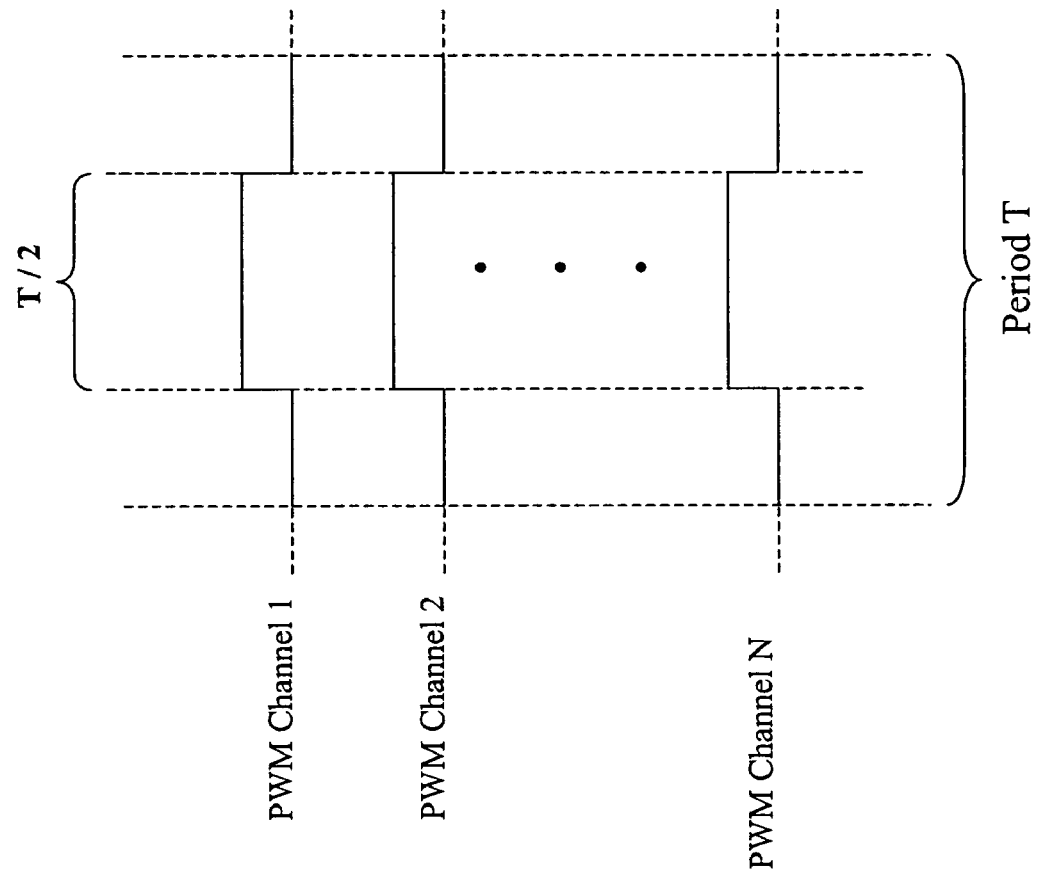
FIG. 4 is a timing diagram illustrating selected periods of pulse width modulated output data streams corresponding to the equivalent input streams in a conventional multiple-channel pulse width modulation system.

FIG. 4 is a timing diagram of selected output patterns PWM CHANNEL 1-PWM CHANNEL N, each corresponding to the conversion of a digital input value, in a conventional N channel digital to PWM system. Each depicted pattern PWM CHANNEL 1-PWM CHANNEL N has a fifty-percent (50%) duty cycle with equal logic high and logic low sub-periods of T/2 time slots, in which T is the period of one PWM pattern in number of time slots. In this example, the logic high periods are contiguous and centered around the midpoint of the PWM period T. The exemplary equivalent duty cycles of patterns PWM CHANNEL 1-PWM CHANNEL N are the result of equivalent corresponding digital input values, for example digital values representing zero (0) in a system processing data between a maximum negative input value and a maximum positive value. In the example shown in FIG. 4, both the rising and falling edges of the depicted patterns are proximate in time. These coinciding edges result in cross-talk between the generating data paths 201a, ..., N.

Figure 5B:
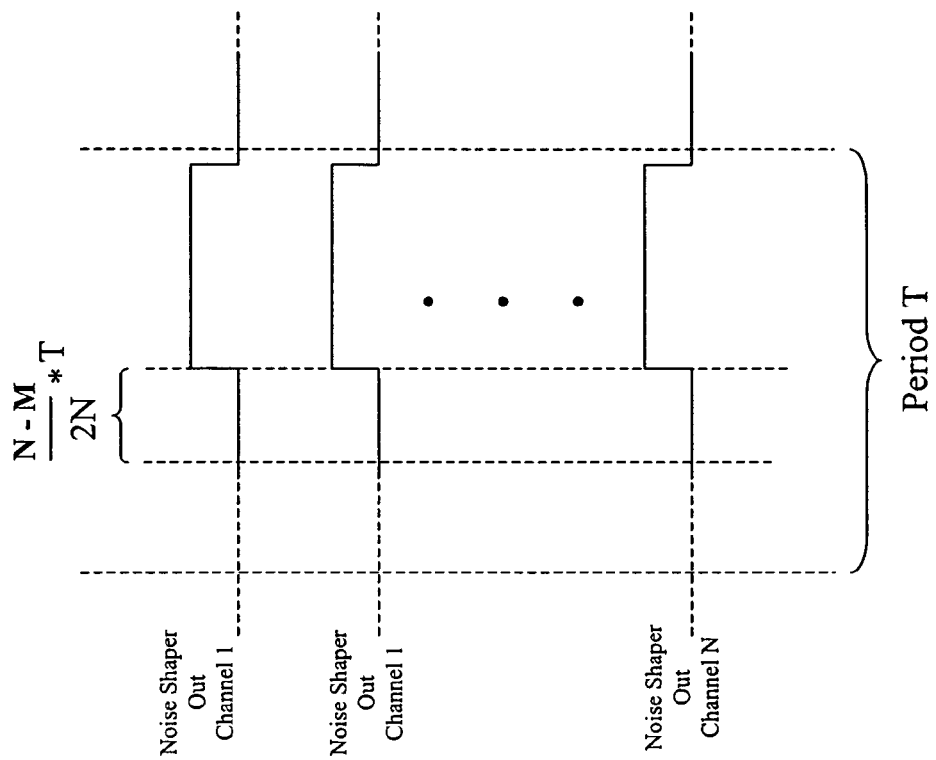
FIGS. 5A and 5B are timing diagrams respectively showing selected periods of the pulse width modulated outputs of corresponding pulse width modulator stages after application of a selected PWM output delay according to the principles of the present invention and after restoration of the original signal relationships by application of an input delay.
Figure 5A:
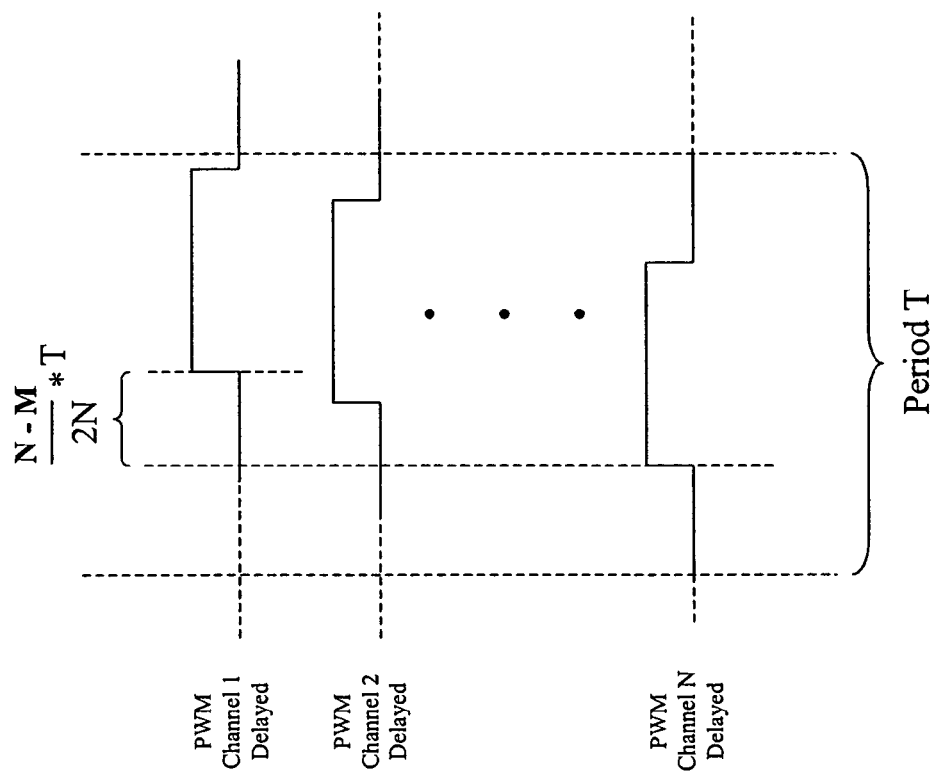

FIG. 5A is a timing diagram illustrating the outputs of PWM stages 204 of data paths 201a, ..., N, after introduction of an offset in the PWM pattern by the offset clock signals generated by clock generator 205 of FIG. 2. In this example, each delayed output pattern PWM CHANNEL 1 DELAYED-PWM CHANNEL N DELAYED has a fifty percent (50%) duty cycle over the period T. The delay in the output of each PWM stage 204 is an amount [(N−M)/2N]*T, again, in which N is the total number of channels being processed and M is the channel number between 1 and N for the particular channel. For example, in a four channel system (i.e. N=4), clock generator 205 delays the output of PWM stage 204 of data path 201a by an amount of ⅜*T, the output of PWM stage 204 of data path 201b by an amount ⅔*T, the output of PWM stage 204 of data path 201c by an amount ⅛*T, and the output of PWM stage 204 of data path 201d by zero (0). Consequently, the outputs of PWM stages 204 of data paths 201a, ..., N do not switch in close time proximity, thereby reducing the chance of cross-talk between processing paths 201a, ..., N.

The delay of any PWM pattern PWM CHANNEL 1 DELAYED-PWM CHANNEL N DELAYED does not change the integrity of that particular signal PWM CHANNEL 1 DELAYED-PWM CHANNEL N DELAYED. In other words, the duty cycle of a given stream of PWM patterns is not affected, and the time relationship between different patterns in the same stream is not affected since all patterns are uniformly delayed. However, the time relationship between the corresponding patterns PWM CHANNEL 1 DELAYED-PWM CHANNEL N DELAYED is altered by the differing delays introduced by clock generator 205. Therefore, according to the inventive principles, the delays introduced by interpolations filters 203 of data paths 201a, ..., N of FIG. 2 realign the edges of the signals PWM CHANNEL 1 DELAYED-PWM CHANNEL N DELAYED and ensure proper signal to signal timing relationships in the resulting patterns to the associated output drivers 206.

FIG. 5B is a timing diagram illustrating the delayed data streams NOISE SHAPER OUT CHANNEL 1-SHAPER OUT CHANNEL N output from noise shapers 203 of data paths 201a, ..., N of FIG. 2. NOISE SHAPER OUT CHANNEL 1-SHAPER OUT CHANNEL N may be a multi-bit output or a single bit output. Generally, channel M of an N channel system is delayed by an amount [(M−1)/2N]*T by the corresponding interpolation filter 202 of FIG. 2. Continuing with an embodiment having four data paths 201a, ..., N (i.e. N=4), interpolator 203 of data path 201a delays the channel 1 input stream into the following PWM stage 204 by zero (0). Consequently, interpolator 203 of data path 201b introduces a delay of ⅛*T, interpolator 203 of data path 201c introduces a delay of ⅔*T, and interpolator 203 of data path 201d introduces a delay of ⅜*T.

The delays introduced by clock generator 205 and interpolators 203 of FIG. 2 are implemented by dedicated on-chip circuitry or by a digital signal processor (DSP) and associated hardware. The delays are applied uniformly to all digital input values or alternatively, only when the digital input values all approach a selected low value.

Although the invention has been described with reference to a specific embodiment, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A pulse width modulation system comprising:
   a pulse width modulation stage for generating a pulse width modulated signal in response to an input signal;
   an other pulse width modulation stage for generating an other pulse width modulated signal in response to an other input signal, wherein the input signal and the other input signal transmit different information content; and
   circuitry for ensuring that edges of the pulse width modulated signal and the other pulse width modulated signal are spaced in time by a selected amount for small levels of the input signal.

2. The pulse width modulation system of claim 1, further comprising circuitry for maintaining a time relationship between the input signal and the other input signal in an output stream and another output stream.

3. The pulse width modulation system of claim 1, wherein the circuitry for ensuring comprises clock generation circuitry for generating offset clock signals for offsetting the edges of the pulse width modulated signal and the other pulse width modulated signal.

4. The pulse width modulation system of claim 2, wherein the circuitry for maintaining the time relationship between the input signal and the other input signal in an output stream and another output stream comprises circuitry for introducing a delay into at least one of the input signal and the other input signal.

5. The pulse width modulation system of claim 1, wherein the input signal and the other input signal comprise digital input signals.

6. The pulse width modulation system of claim 5, wherein the digital input signals comprise audio digital input signals representing low amplitude analog audio signals.

7. A method of performing pulse width modulation comprising:
   generating a pulse width modulated signal in response to an input signal:
   generating an other pulse width modulated signal in response to an other input signal, wherein the input signal and the other input signal transmit different information content; and
   ensuring that transitions of the pulse width modulated signal and the other pulse width modulated signal are spaced in time by a selected amount.

8. The method of claim 7, further comprising maintaining a time relationship between the input signal and the other input signal in an output stream and another output stream.

9. The method of claim 7, wherein ensuring that transitions of the pulse width modulated signal and the other pulse width modulated signal are spaced in time comprises generating offset clock signals for offsetting the edges of the pulse width modulated signal and the other pulse width modulated signal.

10. The method of claim 8, wherein maintaining the time relationship between the input signal and the other input signal in an output stream and another output stream comprises introducing a delay into at least one of the input signal and the other input signal.

11. The method of claim 7, wherein the input signal and the other input signal comprise digital input signals.

12. The method of claim 11, wherein the digital input signals comprise audio digital input signals representing low amplitude analog audio signals.

13. A multiple-channel duty cycle modulation system comprising:
   a plurality of data paths, each including:
      a modulation stage for converting corresponding input data streams, each transmitting different information content, into a corresponding stream of duty cycle modulated data patterns, the modulation stage delaying the duty cycle modulated patterns by a selected amount of delay relative to an amount of delay introduced into duty cycle modulated data patterns generated by the modulation stage of at least one other data path to space apart transitions of the modulated data patterns generated by the modulation stages of selected ones of the data paths.

14. The multiple-channel duty cycle modulation system of claim 13, wherein a selected one of the data paths further comprises input delay circuitry for delaying the input data stream to maintain a time relationship between input streams to the plurality of data paths in output streams from the plurality of data paths.

15. The modulation system of claim 13, wherein each data path further comprises a noise shaper for noise shaping the corresponding input data stream.

16. The modulation system of claim 13, wherein each data path further comprises an output stage for outputting an analog signal in response to the corresponding duty cycle modulated data pattern.

17. The modulation system of claim 13, wherein the corresponding input data stream of at least one data path comprises digital audio data.

18. The modulation system of claim 13, wherein the modulation stage delays the duty cycle modulated patterns in response to an input data stream representing a low amplitude output signal.

19. The modulation system of claim 13, wherein the modulation stage delays the duty cycle modulated patterns in response to substantially all values of the corresponding input streams.

20. The modulation system of claim 13, wherein the modulator stage of each data path introduces a delay of $[(N-M)/N]*T$, in which N is the number of channels in the multiple channel system, M is the corresponding channel number of the data path, and T is the period of each duty cycle modulated data pattern.

21. The modulation system of claim 14, wherein the input delay of each path introduces a delay of $[(M-1)/N]*T$.

* * * * *